United States Patent
Bhatsoori et al.

(10) Patent No.: US 9,390,769 B1
(45) Date of Patent: Jul. 12, 2016

(54) SENSE AMPLIFIERS AND MULTIPLEXED LATCHES

(71) Applicant: GLOBALFOUNDRIES INC., Grand Cayman (KY)

(72) Inventors: Vinay Bhatsoori, Karnataka (IN); George M. Braceras, Essex Junction, VT (US); Venkatraghavan Bringivijayaraghavan, Tamilnadu (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/922,323

(22) Filed: Oct. 26, 2015

(51) Int. Cl.
  *G11C 7/00* (2006.01)
  *G11C 7/06* (2006.01)
  *H03K 3/037* (2006.01)
  *G11C 7/10* (2006.01)

(52) U.S. Cl.
  CPC .............. *G11C 7/065* (2013.01); *G11C 7/106* (2013.01); *G11C 7/1087* (2013.01); *H03K 3/037* (2013.01)

(58) Field of Classification Search
  CPC .......... G11C 7/062; G11C 7/08; G11C 7/1069
  USPC .................. 365/185.21, 196, 189.02, 230.02
  See application file for complete search history.

(56) References Cited

U.S. PATENT DOCUMENTS

| | | | |
|---|---|---|---|
| 6,320,816 B2 | 11/2001 | Seyyedy et al. | |
| 6,378,008 B1 | 4/2002 | Gradinariu | |
| 6,906,558 B2 | 6/2005 | Lee et al. | |
| 7,149,129 B2 | 12/2006 | Vernenker et al. | |
| 7,313,040 B2 | 12/2007 | Huang et al. | |
| 7,701,257 B2 | 4/2010 | Bae | |
| 8,536,898 B2 | 9/2013 | Rennie et al. | |
| 8,798,530 B2 | 8/2014 | Chow et al. | |
| 2006/0087897 A1* | 4/2006 | Vernenker | G11C 7/103 365/189.05 |
| 2011/0068842 A1* | 3/2011 | Hoxey | G11C 7/106 327/199 |
| 2013/0076393 A1 | 3/2013 | Stephani et al. | |

* cited by examiner

*Primary Examiner* — Han Yang
(74) *Attorney, Agent, or Firm* — Gibb & Riley, LLC; Anthony J. Canale

(57) ABSTRACT

Multiplexed latches include a multiplexor having a first data input, a second data input, a selection input, and a multiplexor output. A first latch has a first latch clock input, and a first latch output. A second latch has a second latch clock input, and a second latch output. The first latch output is connected to the first data input of the multiplexor, and the second latch output is connected to the second data input of the multiplexor. A feedback loop connects the multiplexor output to the first latch clock input and the second latch clock input. When the selection signal is received by the multiplexor, the feedback loop feeds the output from the multiplexor back to the latches to maintain the existing latch output until the clock signal transitions, to avoid glitches in the multiplexor output when the selection signal and clock signal are not synchronized.

20 Claims, 11 Drawing Sheets

SENSE AMPLIFIERS AND MULTIPLEXED LATCHES

BACKGROUND

The present disclosure relates to multiplexors, and more specifically, to sense amplifiers used with multiplexed latches.

An electronic multiplexor (or MUX) is a device that selects one of several analog or digital input signals (D0, D1, etc.) and forwards the selected input into a single output line (Q); and such a device can sometimes be called a data selector.

A sense amplifier is an analog element that can be part of the read circuitry of electronic memory, where data is stored in the electronic memory as charges in small capacitors that are accessed through transistors. For example, sense amplifiers can sense the low power signals from a bitline that represents a data bit (1 or 0) stored in a memory cell, and amplify the small voltage swing to recognizable logic levels so the data can be interpreted properly by logic outside the memory. Sense amplifier circuits can use transistors, and there can be one sense amplifier for each column of memory cells.

SUMMARY

Multiplexed latches herein include a multiplexor having a first data input, a second data input, a selection input, and a multiplexor output. A first latch has a first latch clock complement input, and a first latch output. A second latch has a second latch clock complement input, and a second latch output. The first latch output is connected to the first data input of the multiplexor, and the second latch output is connected to the second data input of the multiplexor.

A feedback loop connects the multiplexor output to the first latch clock complement input and the second latch clock complement input. The selection input of the multiplexor receives either a first latch selection signal or a second latch selection signal.

When the selection input of the multiplexor receives the first latch selection signal, the feedback loop forces the first latch output to remain unchanged until the first latch clock complement input transitions. Similarly, when the selection input of the multiplexor receives the second latch selection signal, the feedback loop forces the second latch output to remain unchanged until the second latch clock complement input transitions. Thus, the feedback loop feeds the output from the multiplexor back to the latches to maintain the existing latch output until the clock signal transitions, to avoid glitches in the multiplexor output that occur when the selection signal and clock signal are not synchronized.

Alternative electronic memory devices herein include memory cells, sense amplifiers connected to the memory cells, and multiplexed latches connected to the sense amplifiers. Each of the multiplexed latches includes a multiplexor having a first data input, a second data input, a selection input, and a multiplexor output.

Additionally, each of the multiplexed latches includes a first sense amplifier latch, a second sense amplifier latch and a redundant sense amplifier latch selectively connected by switches to the multiplexor (all acting as NOR latches).

The sense amplifier latches have sense amplifier latch clock complement inputs and sense amplifier latch outputs. The sense amplifier latch clock complement inputs (that can be inverters) pass signals from the multiplexor output to the sense amplifier latch output (through operational amplifier drivers). The inverters are controlled by a complement clock signal (that is complementary to a clock signal).

Further, each of the multiplexed latches includes a feedback loop connecting the multiplexor output to the first sense amplifier latch, the second sense amplifier latch, and the redundant latch.

Through steering signals, the switches connect only two of: the first sense amplifier latch; the second sense amplifier latch; and the redundant latch to the multiplexor output at a time. Also, depending upon settings of the switches, two of: the first sense amplifier latch output; the second sense amplifier latch output; and the redundant latch output are connected to the first data input and the second data input of the multiplexor at a time.

The selection input of the multiplexor receives either a first sense amplifier latch selection signal or a second sense amplifier latch selection signal. While the selection input of the multiplexor receives the first sense amplifier latch selection signal, the feedback loop forces the first sense amplifier latch output to remain unchanged until the first sense amplifier latch clock complement input transitions (to a first different clock state that is different from a first previous clock state that was present before the multiplexor received the first sense amplifier latch selection signal). Similarly, while the selection input of the multiplexor receives the second sense amplifier latch selection signal, the feedback loop forces the second sense amplifier latch output to remain unchanged until the second sense amplifier latch clock complement input transitions (again to a second different clock state that is different from a second previous clock state that was present before the multiplexor received the second sense amplifier latch selection signal).

BRIEF DESCRIPTION OF THE DRAWINGS

The embodiments herein will be better understood from the following detailed description with reference to the drawings, which are not necessarily drawn to scale and in which.

DETAILED DESCRIPTION

This disclosure presents structures that feed back multiplexor output to latches to enable the multiplexor selection to change in advance for the next operation. Also, such structures can enable redundant sense amplifiers and perform steering to perform seamless operation during redundancy.

More specifically, the devices herein incorporate sense amplifiers into multiplexed latches, where the multiplexor output is fed back to latches, and steering logic is also used to access redundant latches. Therefore, the devices herein feedback multiplexor output data to the latch, which steers the data during the redundancy. With the devices herein, the latch output is supplied to the multiplexor (depending on column address) and the output from the multiplexor is fed back to force the unselected column latch output. In other words, the devices herein use the multiplexor output to force the unselected column sense amplifier output to eliminate output glitches without affecting performance. With such structures, the decode address (RCA) can be setup in advance and the data flows through, there is no Q toggling in between cycles, and no complex timing.

Figure 1:
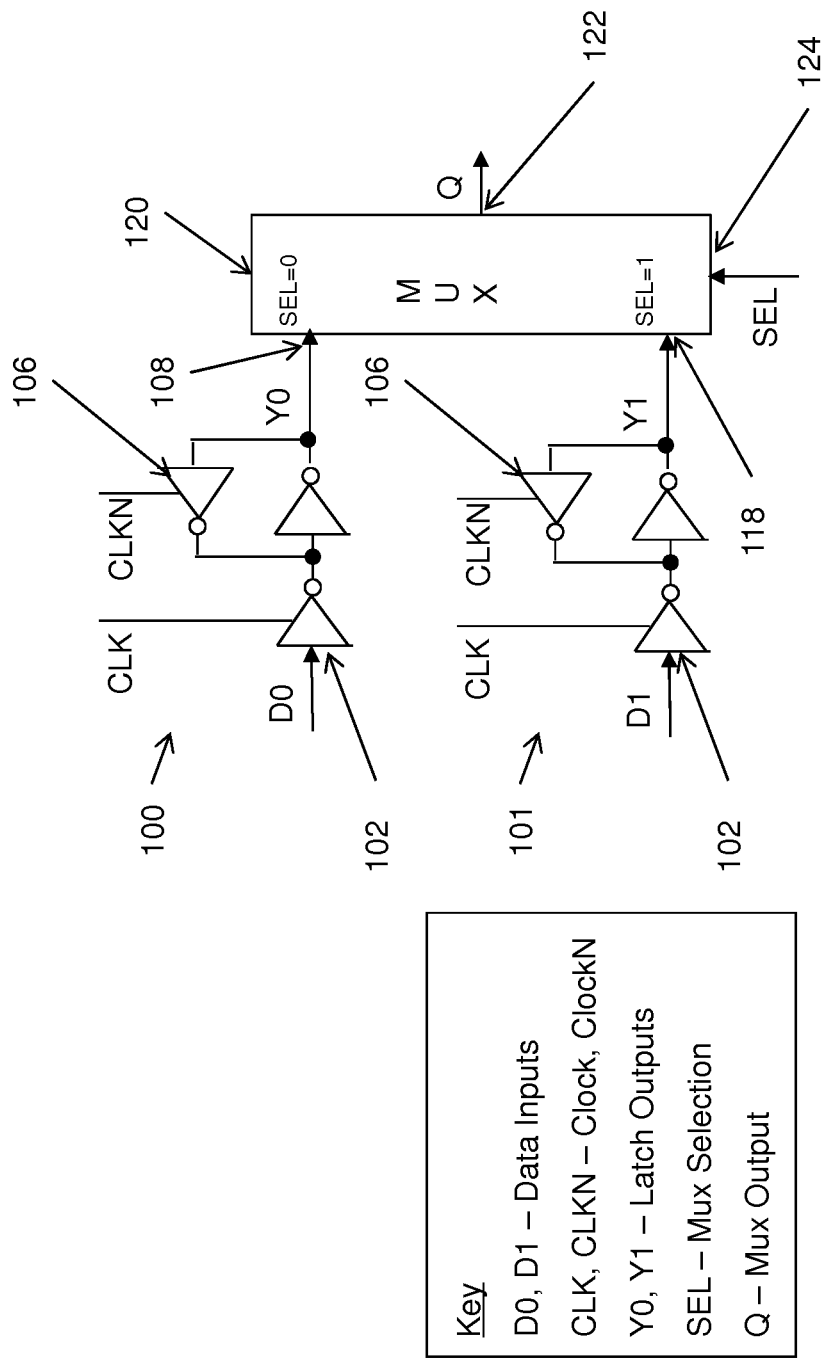
FIG. 1 is a schematic diagram illustrating a multiplexed latch structure herein.

More specifically, FIG. 1 illustrates one structure 100 where two data inputs (D0, D1) are processed along a latch path until the data input D0 is output to the first input 108 of the multiplexor 120 as the latch output Y0, and the data input D1 is output to the second input 118 of the multiplexor 120 as the latch output Y1. As shown in FIG. 1, the first data input D0 is gated by a latch 102 based on a clock signal (CLK), and the second data input D1 is gated by a latch 102, also based on the clock signal (CLK). The data output Y0 is fed back to the latch gated by latch 106 based on a clock complement signal (CLKN) and data output Y1 is similarly fed back to the latch gated by latch 106, also based on the clock complement signal (CLKN). The multiplexor 120 outputs the signal input to the first input 108 or the second input 118 based on the selection (SEL) signal input to selector input 124; and such a selected signal Q is output on multiplexor output 122.

Figure 2:
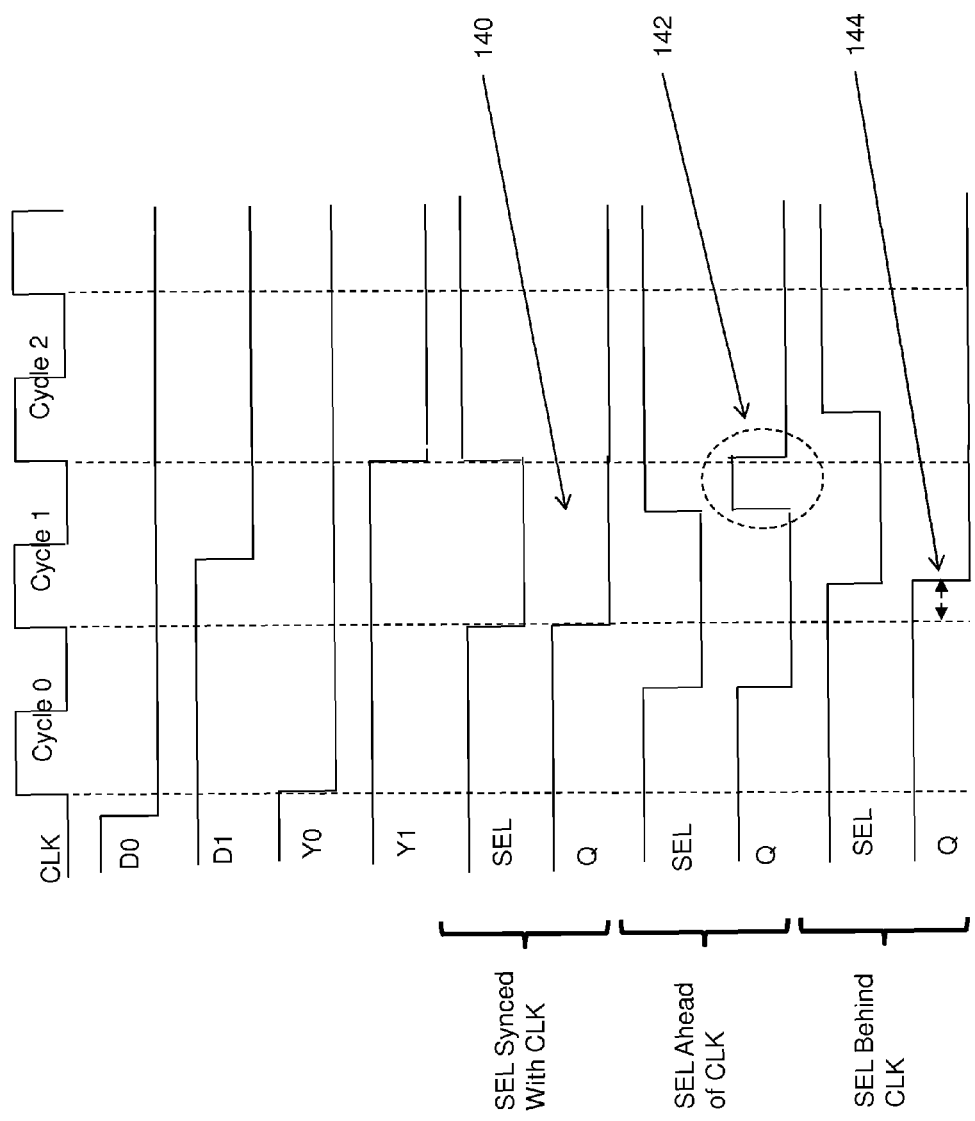
FIG. 2 is a timing diagram of the signals shown being processed by the structure in FIG. 1.

FIG. 2 is a timing diagram of the signals shown being processed by the structure in FIG. 1. The lower section of the timing diagram in FIG. 2 illustrates three situations: one situation where the selection signal (SEL) is received by the multiplexor 120 in synchronization with the clock (CLK) signal cycle; another situation where the selection signal (SEL) is received by the multiplexor 120 ahead of (before) the clock (CLK) signal cycle; and a third situation where the selection signal (SEL) is received by the multiplexor 120 behind (after) the clock (CLK) signal cycle.

As would be understood by those ordinarily skilled in the art, the output from the multiplexor Q depends upon which input is selected (Y0 or Y1) by the selection signal (SEL) and the voltage of that signal (Y0 or Y1) that is currently provided to each selector input (108 or 118). Therefore, the examples of transitions from 0 to 1 or 1 to 0 herein are arbitrary, and are only presented as examples of signal transitions, as the structures herein can work effectively with any form of signal transition.

As shown by identification numeral 140, when the selection signal (SEL) is received by the multiplexor 120 in synchronization with the clock (CLK) signal cycle (SEL transitions in synchronization with CLK transition), this is the ideal case and the output from the multiplexor Q transitions (in this example from 1 to 0) exactly when the selection signal is received, without changing thereafter. However, because the selection signal (SEL) and the clock signal (CLK) use different logic paths, it is practically difficult to align or synchronize the edges of such signals.

Therefore, as also shown in FIG. 2, the selection signal (SEL) can sometimes be received by the multiplexor 120 ahead of the clock (CLK) signal cycle (e.g., SEL transitions before CLK transition within a single clock cycle), which causes the multiplexor output Q to briefly transition (in this example from 1 to 0) and back (a situation that is sometimes referred to as a "glitch") at the end of a clock cycle in which the multiplexor output Q had most recently transitioned (to 0 in this example) in response to the selection signal (shown by identification numeral 142). Such glitches in Q relate to when Q hold time reduces, there is power loss, and characterization issues.

Also seen in FIG. 2, the selection signal (SEL) may be received by the multiplexor 120 behind the clock (CLK) signal cycle (e.g., SEL transitions after CLK transition within a single clock cycle). As indicated by identification numeral 144, this Q transition delay (shown by the double-headed arrow in FIG. 2) slows down the Q transition, resulting in performance loss.

Figure 3:
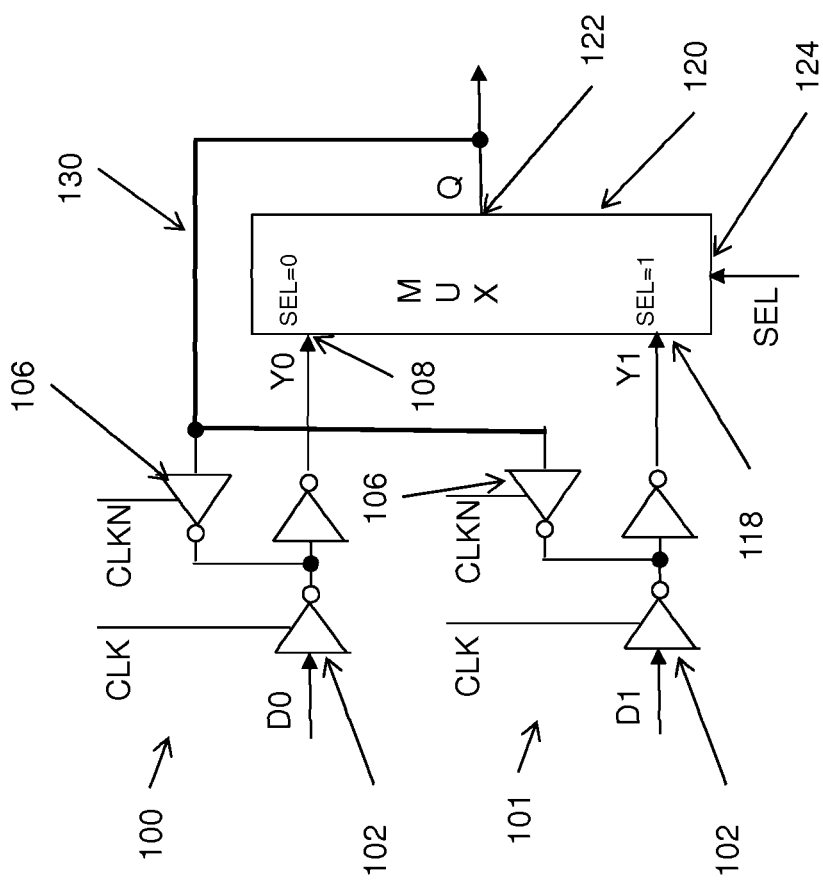
FIG. 3 is a schematic diagram illustrating a multiplexed latch structure herein.
Figure 4:
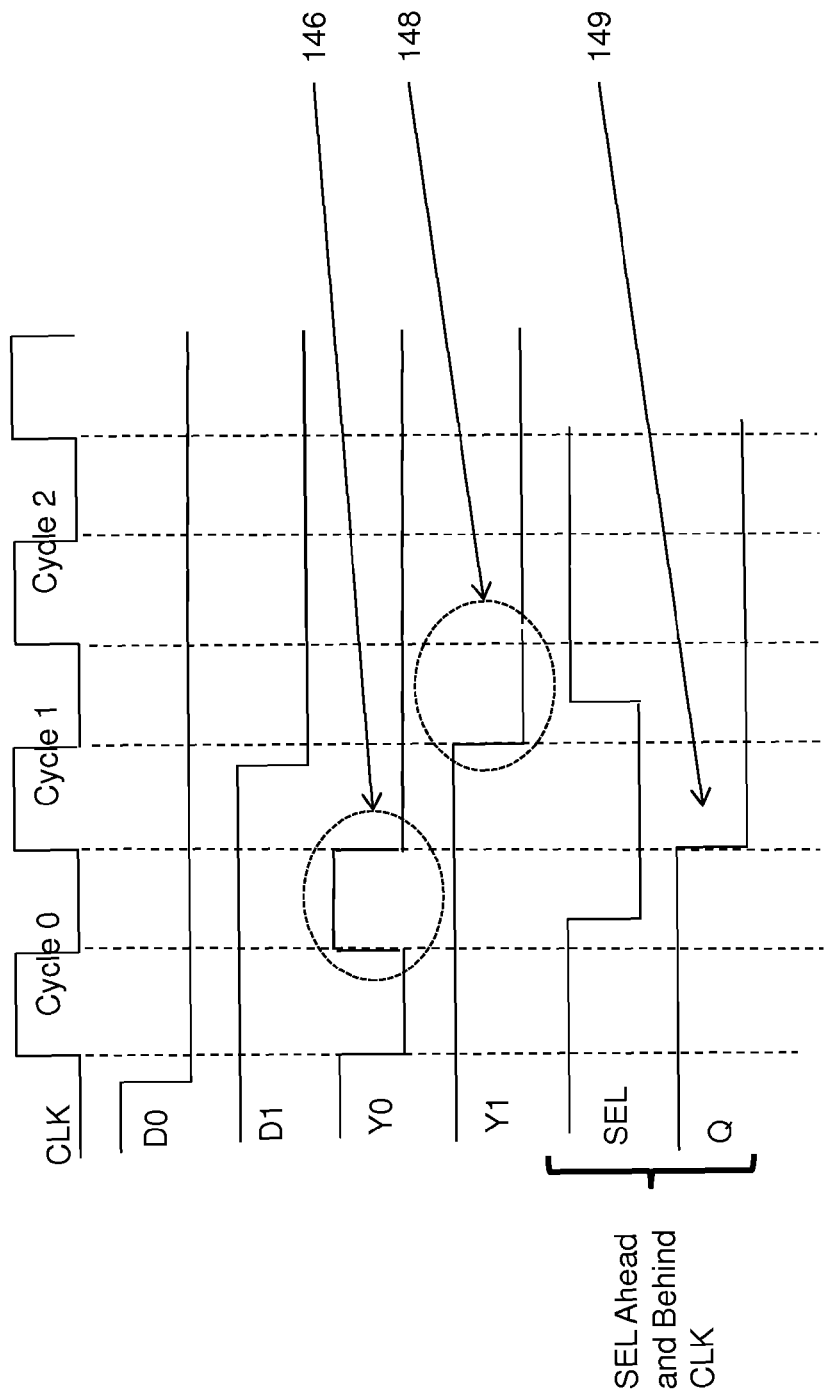
FIG. 4 is a timing diagram of the signals shown being processed by the structure in FIG. 1.

In view of this, as shown in FIG. 3, other devices herein include a feedback loop 130. Thus, in order to avoid the Q glitch 142 for latches in the latched state when CLK=0, the integrated circuit structure shown in FIG. 3 feeds back the current 'Q' data to all the latches using the feedback loop 130. The timing diagram in FIG. 4 illustrates the operation of the structure shown in FIG. 3. More specifically, the feedback loop 130 enables the SEL to toggle in advance, and prevents any glitch in the Q because the feedback loop 130 causes the data in all the latches to be the same as the current Q data. Thus, as shown by identification reference 146, the Q of Cycle 0 is forced to the unselected latch's output Y0 at CLK=Low. Similarly, Q of Cycle 1 is forced to the unselected latch's output Y1 at CLK=Low. Therefore, as seen in the output signal Q (149) in FIG. 4, with the feedback loop 130 in place, there is neither loss in performance nor glitches in Q.

Figure 5:
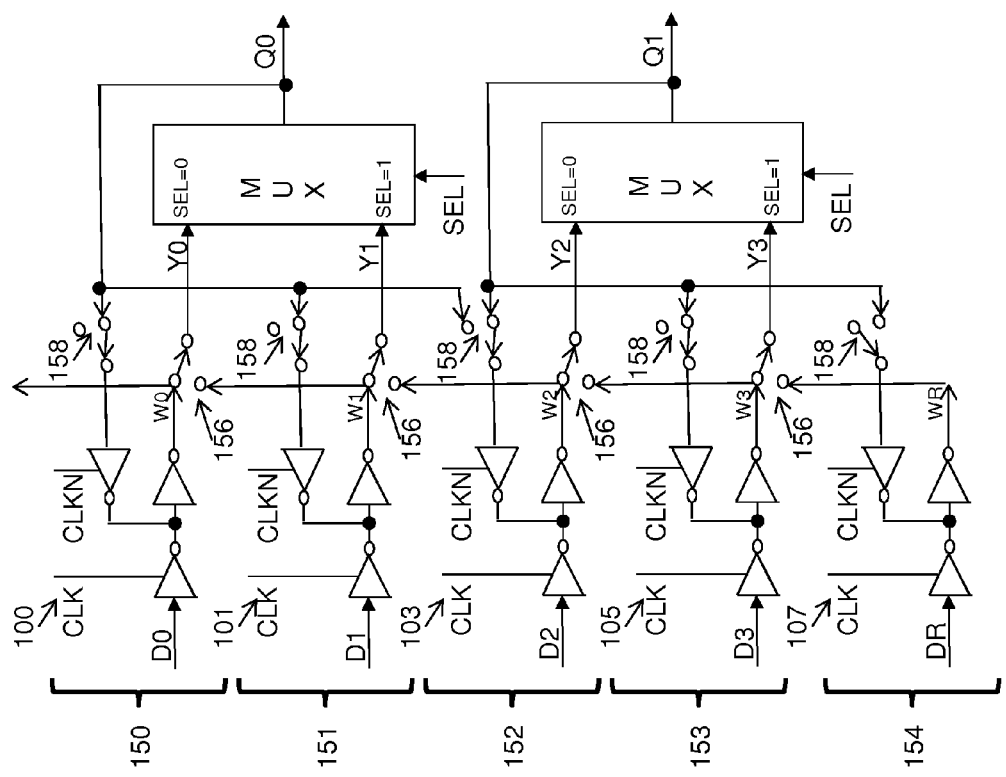
FIG. 5 is a schematic diagram illustrating a multiplexed latch structure herein.

FIG. 5 illustrates a sense amplifier multiplexed latch structure that uses many of the multiplexed latches 100 that are shown in FIG. 3. Note that many of the identification numerals that are shown in FIG. 3 are intentionally omitted from FIG. 5 in order to avoid clutter; however, reference is made to FIG. 3 (and FIG. 1) using overall identification 100 for the identification and description of such devices.

More specifically, FIG. 5 illustrates four original multiplexed latches 150-153 (D0-D3) and a redundant multiplexed latch 154 (DR). FIG. 5 also illustrates various switches 156, 158 that can be selectively set using steering signals in order to disengage a defective original multiplexed latch and engage the redundant multiplexed latch 154. Details of the switches 156, 158 are not illustrated, but those ordinarily skills in the art would understand that the switches can include any form of a combination of transistors, fuses, antifuses, etc., that perform a gating function to selectively connect one wire to another wire (or, alternatively, selectively disconnect one wire from another wire). The transistors that make up each individual switch are controlled by steering signals that selectively steer the different latches to different multiplexor inputs.

In the structure shown in FIG. 5, the redundant latch 154 is not connected (notice that the forward switch 156 and the feedback switch 158 within the redundant multiplexed latch 154 are disconnected from the inputs and outputs of the multiplexor) and instead all original latches 150-153 are connected to the inputs and outputs of the multiplexors by the forward switches 156 and the feedback switches 158. Therefore, FIG. 5 represents the situation where none of the original latches 150-153 are defective (and, in this situation, the redundant latch 154 is not needed) and no steering is required when the redundant latch is not used.

Figure 6:
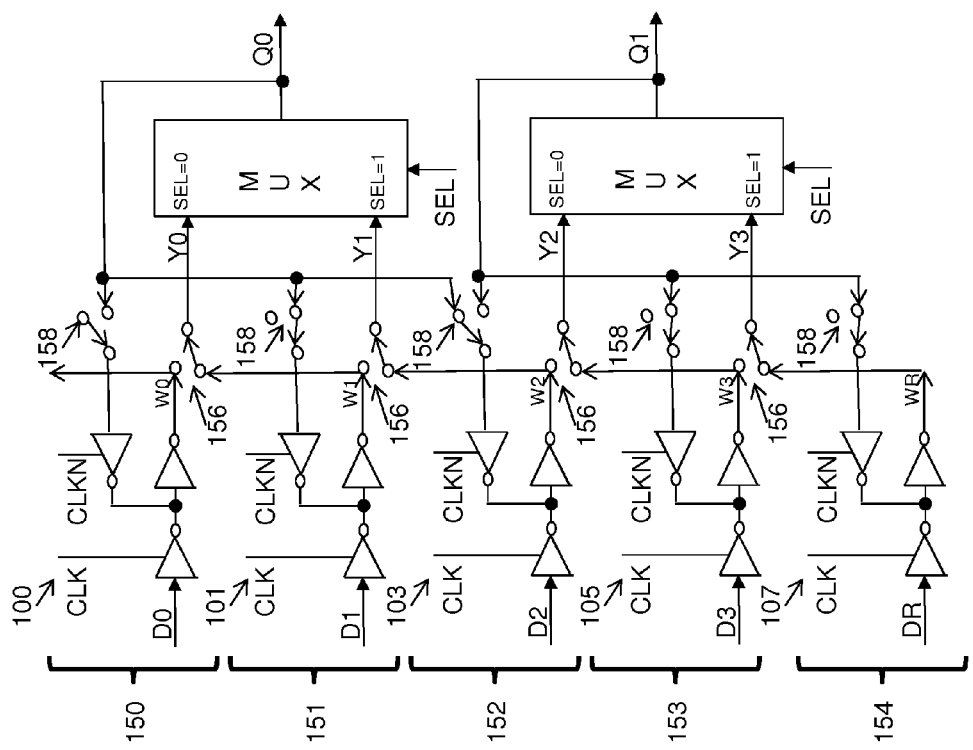
FIG. 6 is a schematic diagram illustrating a multiplexed latch structure herein.

To the contrary, in the structure shown in FIG. 6, the redundant latch 154 is connected and only original latches 151-153 are connected to the inputs and outputs of the multiplexors by the forward switches 156 and the feedback switches 158.

Notice that the forward switch 156 and the feedback switch 158 within the redundant multiplexed latch 154 are connected to the inputs and outputs of the multiplexor, and that the forward switch 156 and the feedback switch 158 within the D0 original multiplexed latch 150 are disconnected from the inputs and outputs of the multiplexor. Therefore, FIG. 6 represents the situation where one of the original latches 150 is defective; and, in this situation, the redundant latch 154 is used based on steering signals supplied to the switches 156, 158.

Figure 7:
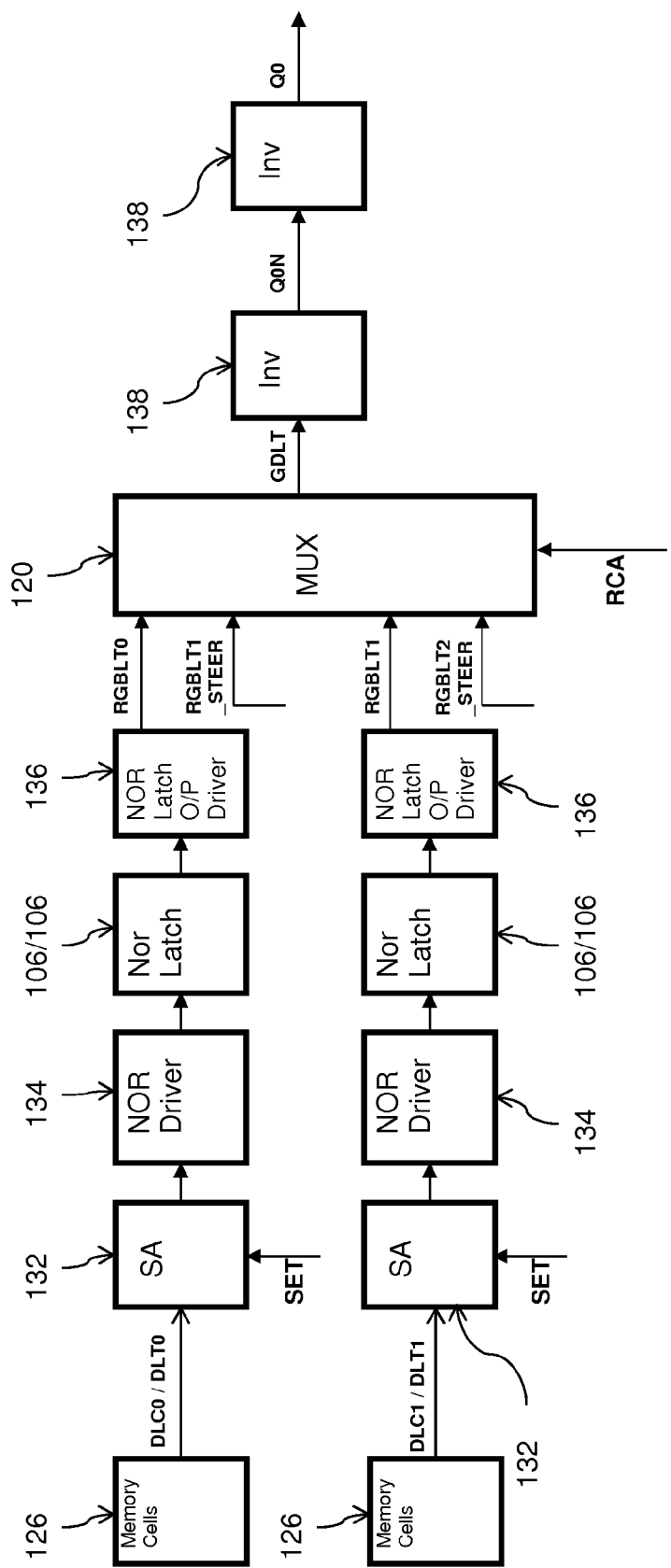
FIG. 7 is a schematic diagram illustrating a sense amplifier multiplexed latch structure herein.

FIG. 7 illustrates the foregoing structures used with sense amplifiers. More specifically, items 132 represent sense amplifiers that receive complement in true data lines (DLC0/DLT1) from memory arrays (memory cells 126), NOR drivers 134, the previously discussed latch 106, a NOR latch operational amplifier (O/P) driver 136, the previously discussed multiplexor 120, and additional inverters 138 that are connected to the output of the multiplexor 120.

Note that, as shown in FIG. 7, the NOR latch O/P driver 136 outputs read global bitline true signals (RGBLT0 and RGBLT1) to the multiplexor 120 for data, and that the multiplexor 120 also receives read global bitline true steering signals (RGBLT1_STEER and RGBLT2_STEER) for selection of redundant and original latches. As shown in FIG. 7, the structures herein can also use the decode address (redundancy cell area (RCA)) as the selection signal provided to the multiplexor 120. Thus, FIG. 7 illustrates a structure where the sense amplifier 132 is connected to the RGBLT driver (134, 106, 136). When the SET signal is high, data will be read from the global bit line and propagated through the RGBLT driver and given to the MUX 120 input.

Figure 8:
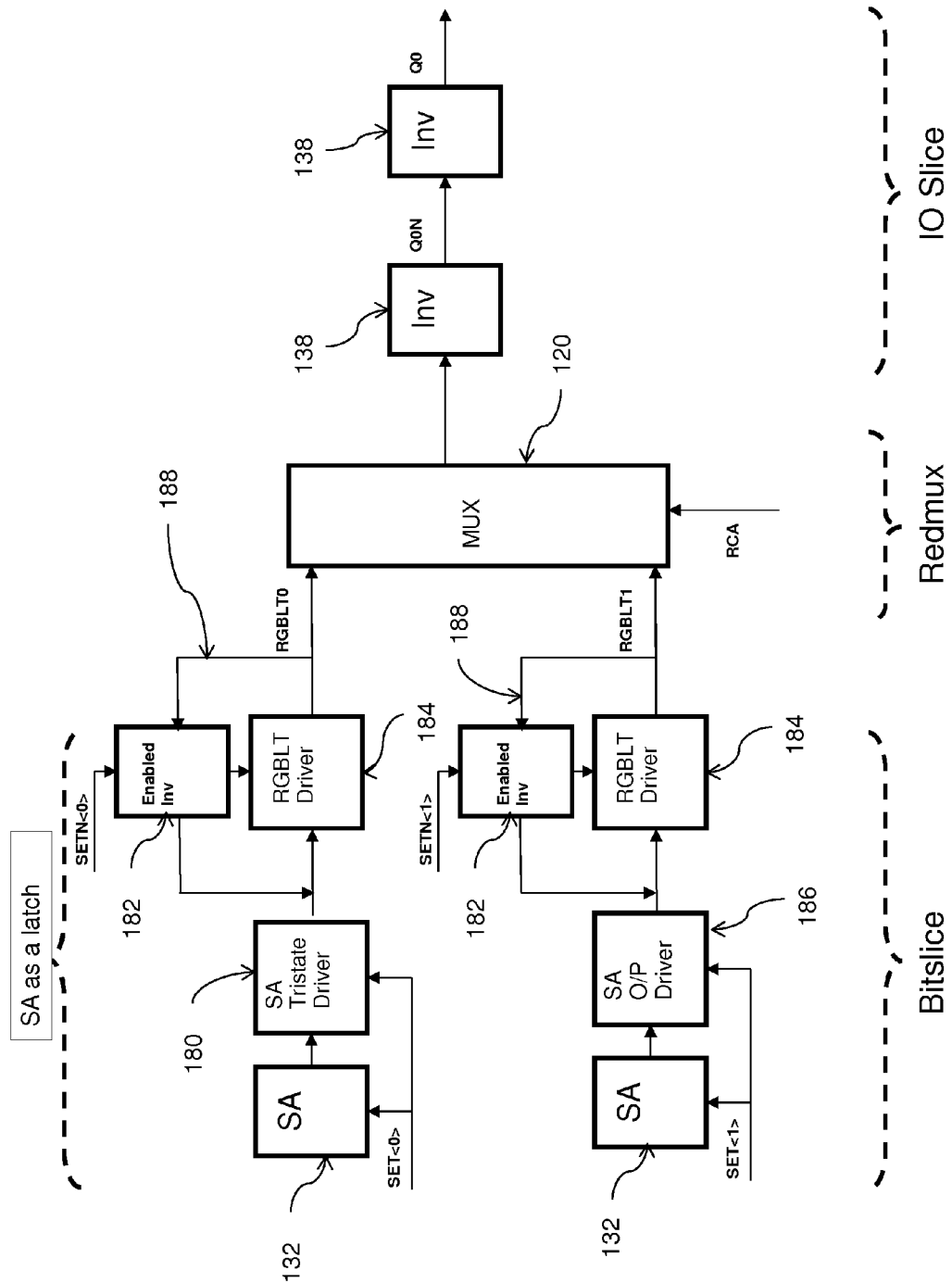
FIG. 8 is a schematic diagram illustrating a sense amplifier multiplexed latch structure herein.

FIG. 8 illustrates a structure (having some similarities to that shown in FIG. 7) that uses the sense amplifiers as latches (SA as a latch) and does not utilize the NOR latches 134, 106, 136 shown in FIG. 7. In the structure shown in FIG. 7, latches 134, 106, and 136 perform the latch and drive operations to allow the latch to be implemented as a set/reset (SR) latch. Thus, with the structure shown in FIG. 7 the logic depth has three gates in the path. More specifically, the RGBLT driver has a two-gate (nor latches 134, 106) and a one-gate (output driver 136) delay. In contrast in the structure shown in FIG. 8, the latch and driver implementation uses items 180, 182, 184. Thus, in the structure shown in FIG. 8, the latch is implemented using tristatable driver 182, thereby reducing the logic depth (where item 188 forms the feedback for the latch).

More specifically, the structure in FIG. 8 includes a tri-state driver 180 (or O/P (operational amplifier) driver 186) receiving output from the sense amplifiers 132, a RGBLT driver 184, and an enabled amplifier 182 within a feedback loop 188. The operations performed by the structure shown in FIG. 8 include the bitslice operation portion that produces and feeds RGBLT to the inputs of the multiplexor (that selects one of the multiple inputs in a redundancy multiplexor (redmux) operation); and the input/output (IO) slice operation (that translates the data to Q) is performed by the inverters 138.

Thus, in the structure shown in FIG. 8, when SET=1, data will be read from the sense amplifier 132 and the tristate driver 180 and propagated to corresponding RGBLT signals (RGBLT0 & RGBLT1). When SET goes low, SETN goes high and the enabled inverter 182 gets transparent (passes data) and the feedback path 188 feeds data back to the output of the SA tristate driver 180. Thus, the feedback path 188 drives the data even when the SET signal goes low (in the same way the structure shown in FIG. 7 does, when the NOR latch o/p driver 136 is used).

Figure 9:
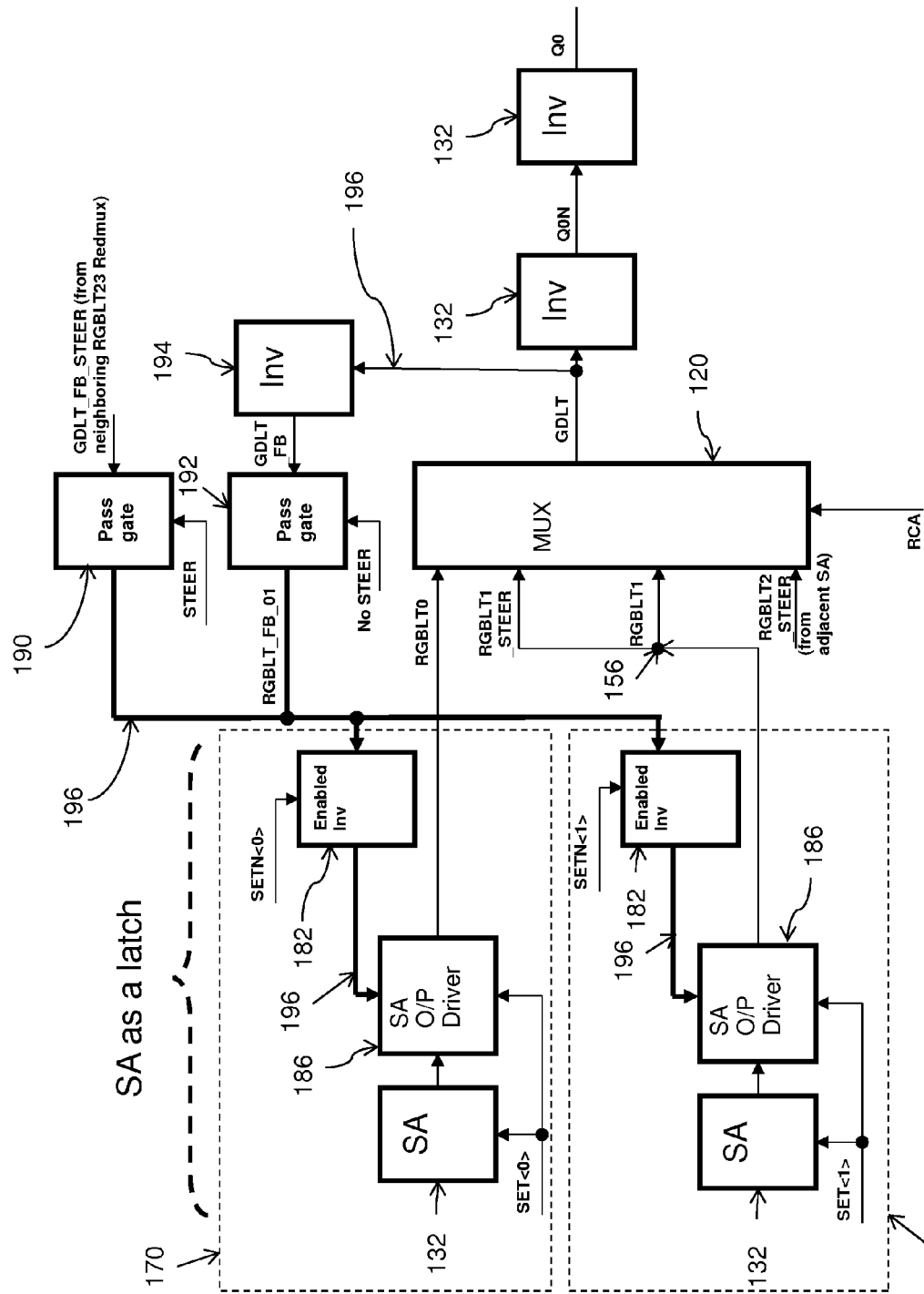
FIG. 9 is a schematic diagram illustrating a sense amplifier multiplexed latch structure herein.

FIG. 9 also presents a structure that utilizes sense amplifiers as latches. More specifically, as shown in FIG. 9, in addition to those elements discussed above, this structure includes pass gates 190, 192 as well as an additional inverter 194 that is utilized in a feedback loop 196. More specifically, as shown in FIG. 9, the pass gate 190 receives the global data bitline true and steering signal from the neighboring multiplexor (GDLT_FB_STEER (from neighboring RGBLT23 Redmux)) and provides this to the feedback loop 196 based upon a steering signal. In a similar manner, pass gate 192 feeds back the output from the multiplexor 120 (GDLT processed through inverter 194) to the feedback loop 196 based upon an opposite steering signal (no steer). This feedback is processed through the enabled inverters 182 into the sense amplifier (operational amplifier) drivers 186.

Additionally, in FIGS. 8 and 9 the true and complement clock signals are shown as "set" signals. Therefore, SETN<0> is equivalent in meaning to the clock complement signal (CLKN) and SETN<1> is equivalent in meaning to the true clock signal (CLK). Further, the feedback switches 158 are shown in FIG. 9 using actual gates 190, 192 gated by steering signals.

As with the structure shown in FIG. 3, discussed above, the structure in FIG. 9 uses the feedback loop 196 to enable the selection signal (RCA) to toggle in advance, and to prevent any glitch in the Q, because the feedback loop 196 causes the data in all the sense amplifier-type latches 186 to be the same as the current Q data. Thus, as noted above, the Q of Cycle 0 is forced to the unselected latch's output at CLK=Low. Similarly, Q of Cycle 1 is forced to the unselected latch's output at CLK=Low. Therefore, with the feedback loop 196 in place, there is neither loss in performance nor glitches in Q.

For ease of illustration in other drawings, the sense amplifier latch elements (sense amplifiers 132, sense amplifier (operational amplifier) driver 186, enabled inverter 182, etc.) are grouped into a single item. Therefore, one sense amplifier latch is shown as item 170 (D0) and another is shown as item 171 (D1). Similarly, the gates 190 and 192 are combined into a single switch for illustration purposes. Therefore, the sense amplifier inverters are shown in Figures using single boxes 170-175; however, each such box is intended to include all elements shown in FIG. 9.

Figure 10:
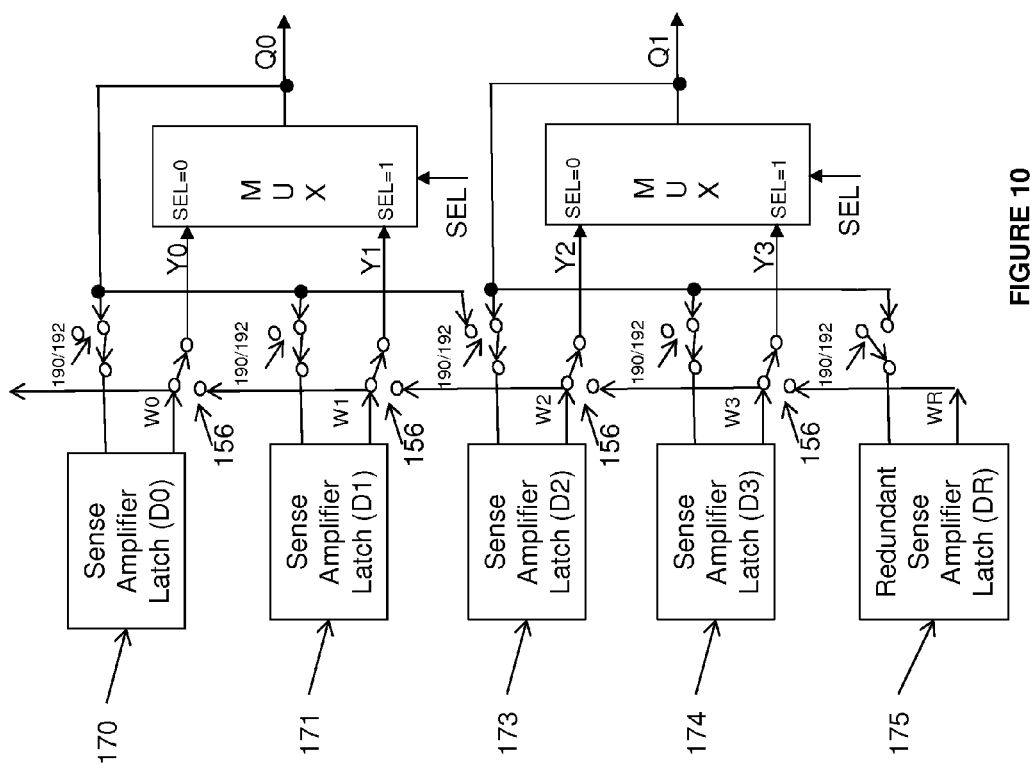
FIG. 10 is a schematic diagram illustrating a multiplexed latch structure herein.

As with the discussion related to FIGS. 5 and 6, redundant sense amplifier latches can be used with structures herein. More specifically, FIG. 10 illustrates four original multiplexed sense amplifier latches 170-173 (D0-D3) and a redundant multiplexed sense amplifier latch 174 (DR). FIG. 10 also illustrates various switches 156, 190/192 that can be selectively set in order to disengage a defective original multiplexed sense amplifier latch and engage the redundant multiplexed sense amplifier latch 174. The items that make up each individual switch are controlled by steering signals that selectively steer the different sense amplifier latches to different multiplexor inputs.

In the structure shown in FIG. 10, the redundant sense amplifier latch 174 is not connected (notice that the forward switch 156 and the feedback switch 190/192 within the redundant multiplexed sense amplifier latch 174 are disconnected from the inputs and outputs of the multiplexor) and instead all original sense amplifier latches 170-173 are connected to the inputs and outputs of the multiplexors by the forward switches 156 and the feedback switches 190/192. Therefore, FIG. 10 represents the situation where none of the original sense amplifier latches 170-173 are defective (and, in this situation, the redundant sense amplifier latch 174 is not needed) and no steering is required when the redundant sense amplifier latch is not used.

Figure 11:
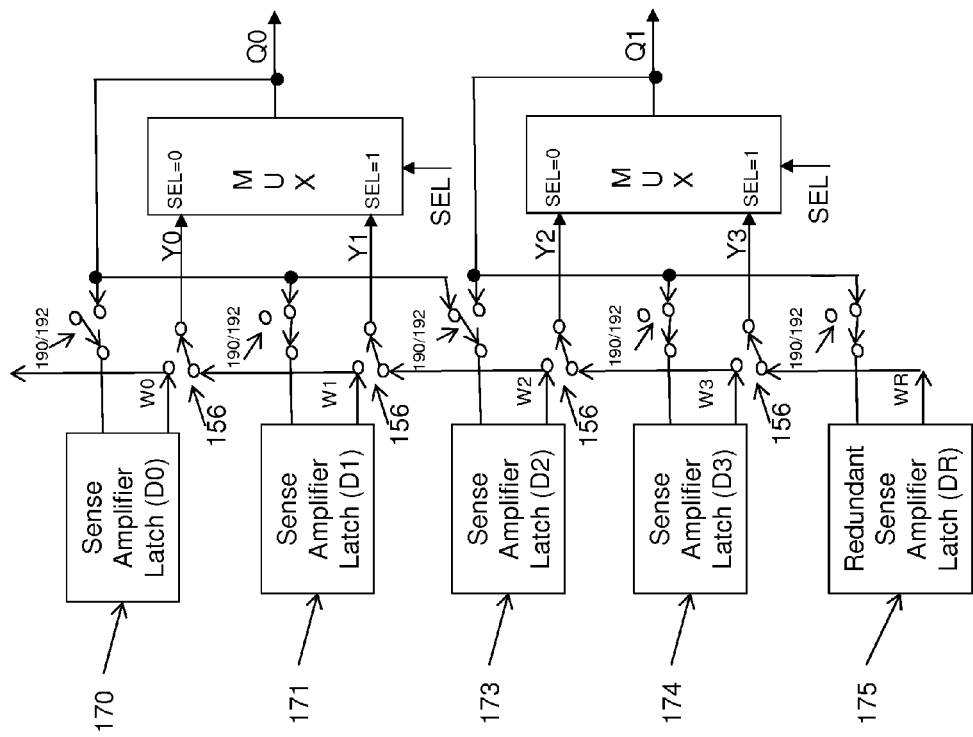
FIG. 11 is a schematic diagram illustrating a multiplexed latch structure herein.

To the contrary, in the structure shown in FIG. 11, the redundant sense amplifier latch 174 is connected and only original sense amplifier latches 171-173 are connected to the inputs and outputs of the multiplexors by the forward switches 156 and the feedback switches 190/192. Notice that the forward switch 156 and the feedback switch 190/192 within the redundant multiplexed sense amplifier latch 174 are connected to the inputs and outputs of the multiplexor, and that the forward switch 156 and the feedback switch 190/192 within the D0 original multiplexed sense amplifier latch 170 are disconnected from the inputs and outputs of the multiplexor. Therefore, FIG. 11 represents the situation where one of the original sense amplifier latches 170 is defective; and, in this situation, the redundant sense amplifier latch 174 is used using steering signals supplied to the switches 156, 190/192.

Thus, as shown above, multiplexed latches 100 herein include a multiplexor 120 having a first data input 108, a second data input 118, a selection input 124, and a multiplexor output 122. A first latch 100 has a first latch clock complement input (gate 106), and a first latch output Y0. A second latch 101 has a second latch clock complement input (gate 106), and a second latch output Y1. The first latch output Y0 is connected to the first data input 108 of the multiplexor 120, and the second latch output Y1 is connected to the second data input 118 of the multiplexor 120.

A feedback loop 130 connects the multiplexor 120 output to the first latch clock complement input 106 and the second latch clock complement input 106. The selection input 124 of the multiplexor 120 receives either a first latch selection signal or a second latch selection signal.

When the selection input 124 of the multiplexor 120 receives the first latch selection signal, the feedback loop 130 forces the first latch output Y0 to remain unchanged until the first latch clock complement input 106 transitions. Similarly, when the selection input 124 of the multiplexor 120 receives the second latch selection signal, the feedback loop 130 forces the second latch output Y1 to remain unchanged until the second latch clock complement input 106 transitions. Thus, the feedback loop 130 feeds the output from the multiplexor 120 back to the latches to maintain the existing latch output until the clock signal transitions, to avoid glitches in the multiplexor 120 output that occur when the selection signal and clock signal are not synchronized.

Alternate electronic memory devices herein include memory cells 126, sense amplifiers 132 connected to the memory cells 126, and multiplexed latches connected to the sense amplifiers 132. Each of the multiplexed latches includes a multiplexor 120 having a first data input 108, a second data input 118, a selection input 124, and a multiplexor output 122.

Additionally, each of the multiplexed latch devices can include a first sense amplifier latch 170, a second sense amplifier latch 171, and a redundant sense amplifier latch 174 selectively connected by switches to the multiplexor 120 (all potentially acting as NOR latches). The sense amplifier latches 170-174 have sense amplifier latch clock complement inputs and sense amplifier latch outputs (RGBLT). The sense amplifier latch clock complement inputs (that can be the enabled inverters 182) pass signals from the multiplexor output 122 to the sense amplifier latch output (through operational amplifier drivers 186). The enabled inverters 182 are controlled by a complement clock signal SETN<0> (that is complementary to a clock signal).

Further, each of the multiplexed latches include a feedback loop 196 connecting the multiplexor output 122 to the first sense amplifier latch 170, the second sense amplifier latch 171, and the redundant latch 174. The switches 190/192 connect only two of: the first sense amplifier latch 170; the second sense amplifier latch 171; and the redundant latch 174 to the multiplexor output 122 at a time. Also, depending upon settings of the switches 156, only two of: the first sense amplifier latch 170 output; the second sense amplifier latch 171 output; and the redundant latch output are connected to the first data input 108 and the second data input 118 of the multiplexor 120 at a time.

The selection input 124 of the multiplexor 120 receives either a first sense amplifier latch selection signal or a second sense amplifier latch selection signal. While the selection input 124 of the multiplexor 120 receives the first sense amplifier latch selection signal, the feedback loop 196 forces the first sense amplifier latch output (Y0 or RGBLT0) to remain unchanged until the first sense amplifier latch clock complement input 182 transitions (to a first different clock state that is different from a first previous clock state that was present before the multiplexor 120 received the first sense amplifier latch selection signal). Similarly, while the selection input 124 of the multiplexor 120 receives the second sense amplifier latch selection signal, the feedback loop 196 forces the second sense amplifier latch 171 output (Y1 or RGBLT1) to remain unchanged until the second sense amplifier latch clock complement input 182 transitions (again to a second different clock state that is different from a second previous clock state that was present before the multiplexor 120 received the second sense amplifier latch selection signal).

The above-described structures can be included within integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated).

In the drawings herein, the same identification numeral identifies the same or similar item. The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A multiplexed latch comprising:
a multiplexor having a first data input, a second data input, a selection input, and a multiplexor output;
a first latch having a first latch clock input, and a first latch output;
a second latch having a second latch clock input, and a second latch output; and
a feedback loop connecting the multiplexor output to the first latch clock input and the second latch clock input,
the first latch output being connected to the first data input of the multiplexor,
the second latch output being connected to the second data input of the multiplexor,
when the selection input of the multiplexor receives a first latch selection signal, the feedback loop forces the first latch output to remain unchanged until the first latch clock input transitions, and
when the selection input of the multiplexor receives a second latch selection signal, the feedback loop forces the second latch output to remain unchanged until the second latch clock input transitions.

2. The multiplexed latch according to claim 1, the first latch clock input comprising a first gate passing signals from the multiplexor output, the first gate being controlled by a complement clock signal that is complementary to a clock signal, and
the second latch clock input comprising a second gate passing the signals from the multiplexor output, the second gate being controlled by the complement clock signal.

3. The multiplexed latch according to claim 2, the first gate passing the signals from the multiplexor output to the first latch output, and
the second gate passing the signals from the multiplexor output to the second latch output.

4. The multiplexed latch according to claim 1, the first latch and the second latch comprising NOR latches.

5. The multiplexed latch according to claim 1, the first latch and the second latch comprising sense amplifier drivers.

6. The multiplexed latch according to claim 1, the first latch output providing read global bitline true (RGBLT) signals and the second latch output providing read global bitline complement signals (RGBLC).

7. The multiplexed latch according to claim 1, the first latch selection signal and the second latch selection signal comprising replica cell array (RCA) memory address signals.

8. An electronic memory device comprising:
memory cells;
a multiplexor having a first data input, a second data input, a selection input, and a multiplexor output;
a first sense amplifier latch connected to the memory cells, the first sense amplifier latch having a first sense amplifier latch clock complement input, and a first sense amplifier latch output;
a second sense amplifier latch connected to a second sense amplifier of the sense amplifiers, the second sense amplifier latch having a second sense amplifier latch clock complement input, and a second sense amplifier latch output; and
a feedback loop connecting the multiplexor output to the first sense amplifier latch and the second sense amplifier latch,
the first sense amplifier latch output being connected to the first data input of the multiplexor,
the second sense amplifier latch output being connected to the second data input of the multiplexor,
the selection input of the multiplexor receiving either a first sense amplifier latch selection signal or a second sense amplifier latch selection signal,
while the selection input of the multiplexor receives the first sense amplifier latch selection signal, the feedback loop forces the first sense amplifier latch output to remain unchanged until the first sense amplifier latch clock complement input transitions, and
while the selection input of the multiplexor receives the second sense amplifier latch selection signal, the feedback loop forces the second sense amplifier latch output to remain unchanged until the second sense amplifier latch clock complement input transitions.

9. The electronic memory device according to claim 8, the first sense amplifier latch clock complement input comprising a first inverter passing signals from the multiplexor output, the first inverter being controlled by a complement clock signal that is complementary to a clock signal, and
the second sense amplifier latch clock complement input comprising a second inverter passing the signals from the multiplexor output, the second inverter being controlled by the complement clock signal.

10. The electronic memory device according to claim 9, the first inverter passing the signals from the multiplexor output to the first sense amplifier latch output, and
the second inverter passing the signals from the multiplexor output to the second sense amplifier latch output.

11. The electronic memory device according to claim 8, the first sense amplifier latch and the second sense amplifier latch comprising NOR latches.

12. The electronic memory device according to claim 8, the first sense amplifier latch and the second sense amplifier latch comprising operational amplifier drivers.

13. The electronic memory device according to claim 8, the first sense amplifier latch output providing read global bitline true (RGBLT) signals and the second sense amplifier latch output providing read global bitline complement signals (RGBLC).

14. The electronic memory device according to claim 8, the first sense amplifier latch selection signal and the second sense amplifier latch selection signal comprising replica cell array (RCA) memory address signals.

15. An electronic memory device comprising:
memory cells; and
multiplexed latches connected to the memory cells, each of the multiplexed latches comprising:
a multiplexor having a first data input, a second data input, a selection input, and a multiplexor output;
a first sense amplifier latch selectively connected by switches to the multiplexor, the first sense amplifier latch having a first sense amplifier latch clock complement input, and a first sense amplifier latch output;
a second sense amplifier latch selectively connected by switches to the multiplexor, the second sense amplifier latch having a second sense amplifier latch clock complement input, and a second sense amplifier latch output;

a redundant latch selectively connected by switches to the multiplexor, the redundant latch having a redundant latch clock complement input, and a redundant latch output; and a feedback loop connecting the multiplexor output to the first sense amplifier latch, the second sense amplifier latch, and the redundant latch, the switches connecting only two of the first sense amplifier latch, the second sense amplifier latch, and the redundant latch to the multiplexor output at a time, depending upon settings of the switches, two of: the first sense amplifier latch output; the second sense amplifier latch output; and the redundant latch output being connected to the first data input and the second data input of the multiplexor, the selection input of the multiplexor receiving either a first sense amplifier latch selection signal or a second sense amplifier latch selection signal, while the selection input of the multiplexor receives the first sense amplifier latch selection signal, the feedback loop forces the first sense amplifier latch output to remain unchanged until the first sense amplifier latch clock complement input transitions to a first different clock state that is different from a first previous clock state that was present before the multiplexor received the first sense amplifier latch selection signal, and while the selection input of the multiplexor receives the second sense amplifier latch selection signal, the feedback loop forces the second sense amplifier latch output to remain unchanged until the second sense amplifier latch clock complement input transitions to a second different clock state that is different from a second previous clock state that was present before the multiplexor received the second sense amplifier latch selection signal.

16. The electronic memory device according to claim 15, the first sense amplifier latch clock complement input comprising a first inverter passing signals from the multiplexor output, the first inverter being controlled by a complement clock signal that is complementary to a clock signal, and the second sense amplifier latch clock complement input comprising a second inverter passing the signals from the multiplexor output, the second inverter being controlled by the complement clock signal.

17. The electronic memory device according to claim 16, the first inverter passing the signals from the multiplexor output to the first sense amplifier latch output, and the second inverter passing the signals from the multiplexor output to the second sense amplifier latch output.

18. The electronic memory device according to claim 15, the first sense amplifier latch and the second sense amplifier latch comprising NOR latches.

19. The electronic memory device according to claim 15, the first sense amplifier latch and the second sense amplifier latch comprising operational amplifier drivers.

20. The electronic memory device according to claim 15, the first sense amplifier latch output providing read global bitline true (RGBLT) signals and the second sense amplifier latch output providing read global bitline complement signals (RGBLC).

* * * * *